United States Patent
Wang et al.

(10) Patent No.: US 12,438,130 B2
(45) Date of Patent: Oct. 7, 2025

(54) LIGHT EMITTING DIODE FILAMENT INCLUDING CHIP SCALE PACKAGE LIGHT EMITTING DIODES TO REDUCE THE AMOUNT OF PHOSPHOR THAT IS INTEGRATED INTO THE FILAMENT

(71) Applicant: LEDVANCE LLC, Wilmington, MA (US)

(72) Inventors: Xinrong Wang, Shenzhen (CN);
Tianzheng Jiang, Shenzhen (CN);
Ming Li, Acton, MA (US)

(73) Assignee: LEDVANCE LLC, Wilmington, MA (US)

( * ) Notice: Subject to any disclaimer, the term of this patent is extended or adjusted under 35 U.S.C. 154(b) by 654 days.

(21) Appl. No.: 17/517,037

(22) Filed: Nov. 2, 2021

(65) Prior Publication Data

US 2023/0137752 A1    May 4, 2023

(51) Int. Cl.
| | |
|---|---|
| H01L 25/00 | (2006.01) |
| C09K 11/77 | (2006.01) |
| F21V 21/005 | (2006.01) |
| H01L 25/075 | (2006.01) |
| H10H 20/01 | (2025.01) |
| H10H 20/825 | (2025.01) |
| H10H 20/851 | (2025.01) |
| H10H 20/853 | (2025.01) |
| H10H 20/857 | (2025.01) |

(52) U.S. Cl.
CPC ...... *H01L 25/0753* (2013.01); *C09K 11/7774* (2013.01); *F21V 21/005* (2013.01); *H10H 20/01* (2025.01); *H10H 20/825* (2025.01); *H10H 20/8512* (2025.01); *H10H 20/8514* (2025.01); *H10H 20/853* (2025.01); *H10H 20/857* (2025.01); *H10H 20/0361* (2025.01); *H10H 20/0362* (2025.01); *H10H 20/0364* (2025.01)

(58) Field of Classification Search
CPC ..... H01L 33/005; H01L 33/32; H01L 33/502; H01L 33/55; H01L 33/54; H01L 33/62; H01L 25/0753; C09K 11/7774
See application file for complete search history.

(56) References Cited

U.S. PATENT DOCUMENTS

| | | | |
|---|---|---|---|
| 10,178,722 B2 * | 1/2019 | Streppel | G02B 19/0023 |
| 2012/0043897 A1 * | 2/2012 | Miskin | H05B 45/30 |
| | | | 315/192 |
| 2015/0108523 A1 * | 4/2015 | Kotani | H10H 20/855 |
| | | | 257/98 |
| 2017/0194538 A1 * | 7/2017 | Chen | H01L 33/505 |
| 2019/0017657 A1 * | 1/2019 | Kim | F21K 9/232 |

(Continued)

*Primary Examiner* — Gerald J Sufleta, II
(74) *Attorney, Agent, or Firm* — Harry Hild

(57) ABSTRACT

A light emitting filament diode that includes a filament substrate; a plurality of light emitting diodes (LEDs) electrically connected and disposed along a length of the filament substrate; and a phosphorus encapsulant present in direct contact with an upper surface and sidewalk of at least one of the plurality of light emitting diodes (LEDs). No portion of phosphorus encapsulant is present overlying a portion of the filament substrate extending between the sidewalls of adjacently situated light emitting diodes having phosphorus encapsulant present thereon. The light emitting filament diode may a include a transparent encapsulant present over at least the light emitting diode chips.

19 Claims, 4 Drawing Sheets

(56) References Cited

U.S. PATENT DOCUMENTS

| | | | |
|---|---|---|---|
| 2020/0124237 A1* | 4/2020 | Xiong .................... | F21K 9/275 |
| 2021/0296530 A1* | 9/2021 | Bailey .................. | H10H 20/855 |
| 2022/0140215 A1* | 5/2022 | Zitzlsperger ........ | H01L 25/0753 |
| | | | 257/79 |
| 2022/0349530 A1* | 11/2022 | Van Bommel ............ | F21K 9/64 |
| 2023/0204169 A1* | 6/2023 | Van Bommel .......... | F21K 9/232 |
| | | | 362/217.01 |
| 2023/0335684 A1* | 10/2023 | Zhang ................ | H01L 25/0753 |

\* cited by examiner

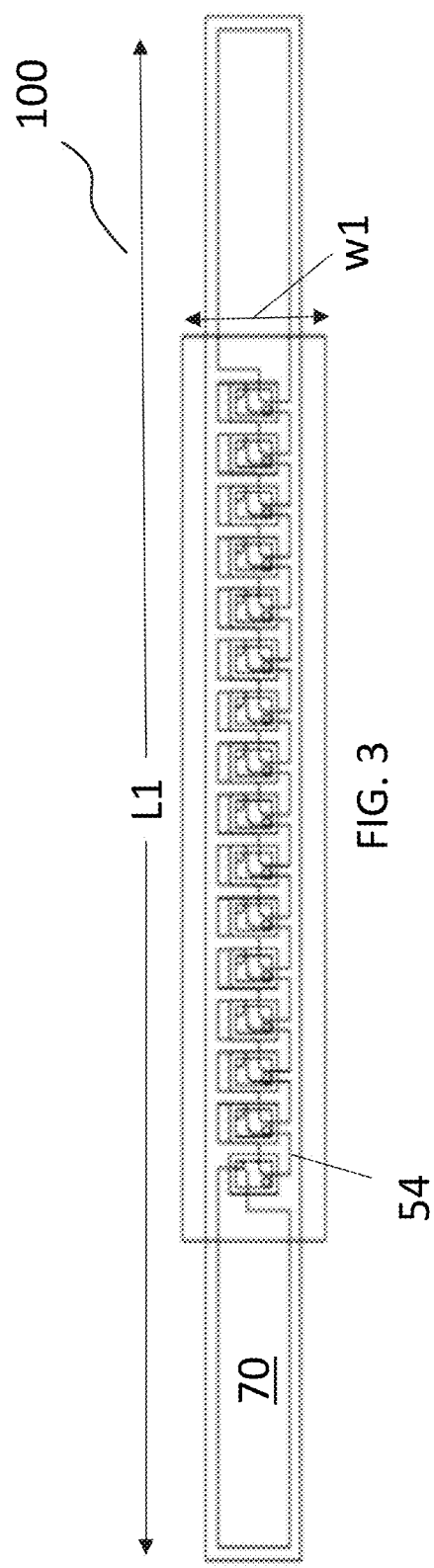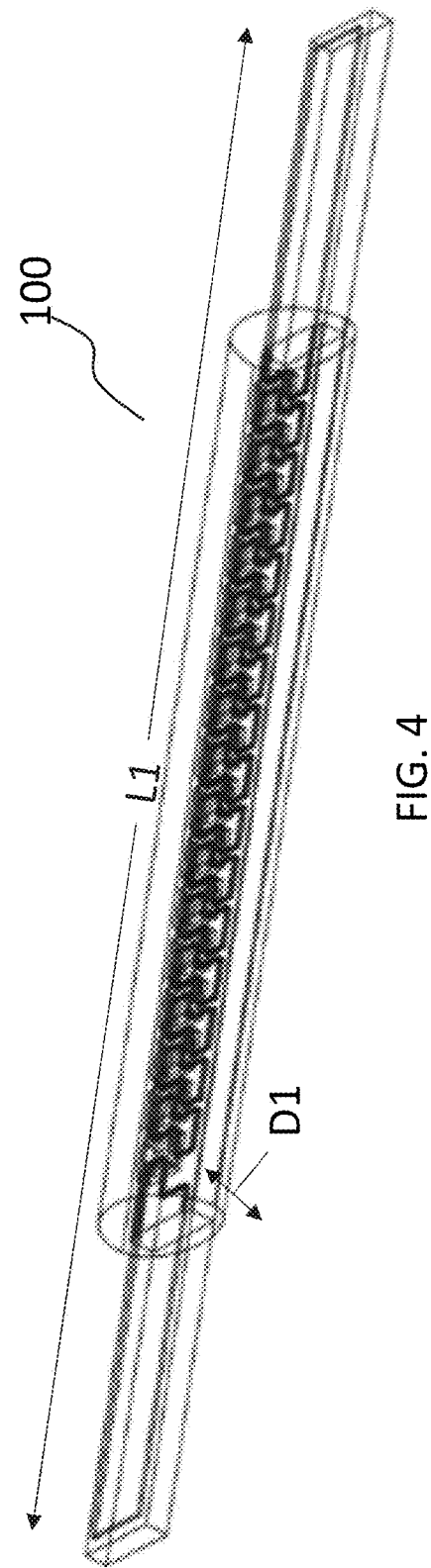

LIGHT EMITTING DIODE FILAMENT INCLUDING CHIP SCALE PACKAGE LIGHT EMITTING DIODES TO REDUCE THE AMOUNT OF PHOSPHOR THAT IS INTEGRATED INTO THE FILAMENT

TECHNICAL FIELD

The present disclosure generally relates to light engines employed in lamp assemblies, and more particularly to light engines employing light emitting diodes for the light source.

BACKGROUND

Conservation and management of electrical power are a growing concern with regard to both cost and environmental impact. In various lighting applications, the use of light emitting diodes (LEDs) for illumination is beginning to emerge as a lighting source with potential for addressing these concerns. LED light sources have a long life, are energy efficient, are durable and operate over a wide temperature range.

An LED filament light bulb is an LED lamp which is designed to resemble a tradition& incandescent light bulb with visible filaments for aesthetic and light distribution purposes, but with the high efficiency of light-emitting diodes (LEDs). It produces its light using LED filaments, which are series-connected strings of diodes that resemble in appearance the filaments of incandescent light bulbs. They are direct replacements for conventional clear (or frosted) incandescent bulbs, as they are made with the same envelope shapes, the same bases that fit the same sockets, and work at the same supply voltage.

SUMMARY

In one aspect, the methods and structures of the present disclosure reduces the amount of phosphor employed in Light Emitting Diode (LED) filament.

In one embodiment, the light emitting diode filament comprises a metal stent substrate, wherein at least a portion of an insulating dielectric layer is present between the metal stent substrate and a circuit having a plurality of contact pads arranged along a length of the metal stent substrate. Light emitting diode (LED) chips are engaged to the contact pads along the length of the metal stent substrate to provide that the LED chips are electrically connected in series, wherein each light emitting diode chip includes at least an upper surface that is in contact with an individual portion of phosphor. A transparent encapsulant is present over the entirety of the light emitting diode chips.

In some embodiments, the length for the LED filament ranges from 3 mm to 30 mm, and the width for the LED filament ranges from 0.3 mm to 2.0 mm.

In some embodiments, the light emitting diode (LED) chips employed in the filament are chip scale package (CSP) light emitting diodes (LEDs).

In some embodiments, the light transmission surface that is in contact with the individual portion of the phosphor is an upper surface of the light emitting diode chip that is opposite the surface of the light emitting diode chip that is bonded to the metal stent substrate.

In some embodiments, the light transmission surface that the individual portion of the phosphor is present on also includes the sidewall surfaces of the light emitting diode chips.

In some embodiments, the phosphor that is present on the sidewall surfaces and the upper surface of the light emitting diode chip is a conformal layer of phosphor material.

In some embodiments, the phosphor has a composition including cerium doped yttrium aluminium garnet (YAG: Ce) crystals.

In another embodiment, the light emitting diode (LED) filament includes a filament substrate; and a plurality of light emitting diodes (LEDs) electrically connected and disposed along a length of the filament substrate. In some embodiments, a phosphorus encapsulant is present in direct contact with an upper surface and sidewalk of at least one of the plurality of light emitting diodes (LEDs). No portion of phosphorus encapsulant is present overlying a portion of the filament substrate extending between the sidewalls of adjacently situated light emitting diodes having phosphorus encapsulant present thereon. In some embodiments, a transparent encapsulant present over at least the light emitting diode chips.

In some embodiments, the filament substrate is comprised of metal selected from the group consisting of stainless steel, copper, brass, aluminum, aluminum alloy, tungsten and combinations thereof.

In some embodiments, the light emitting filament diode of claim 8 further comprising an insulating layer atop the filament substrate having a circuit present thereon, the circuit in electrical communication with In some embodiments, the insulating layer has a dielectric composition selected from the group consisting of alumina ($Al_2O_3$), silicon oxide ($SiO_2$), silicon carbide, glass fiber, glass fiber/epoxy compositions and combinations thereof.

In some embodiments, the plurality of light emitting diodes (LEDs) use a 385 nm-480 light emitting semiconductor material structure.

In some embodiments, the plurality of light emitting diodes (LED) comprise GaN (gallium nitride) light emitting diodes, indium gallium nitride (InGaN) light emitting diodes or a combination thereof.

In some embodiments, the phosphor encapsulant has a composition including cerium doped yttrium aluminium garnet (YAG:Ce) crystals.

In another aspect, a method of assembling a filament light emitting diode is provided. The method for assembling the filament light emitting diode (LED) may include forming a circuit on a filament stent substrate. The circuit includes pads arranged along of length of the filament stent substrate. Light emitting diode (LED) chips can then be bonded to the circuit. The light emitting diode chips include a light emitting diode (LED) die having contacts on a contact surface side of the LED chips for the bonding to the pads of the printed circuit, and having a phosphor layer present on at least a light transmission surface of the LED die that is opposite the contact surface side of the die. The phosphor layer is engaged to the light transmission surface of the LED die prior to the bonding of the light emitting diode chips to the circuit.

In some embodiments, the method further includes forming a transparent encapsulant over at least the light emitting diode (LED) die.

In some embodiments of the method, the bonding of the light emitting diode (LED) chips to the circuit includes solder bonding.

In some embodiments of the method, the plurality of light emitting diodes (LED) use a 385 nm-490 nm light emitting semiconductor material structure.

In some embodiments of the method, the plurality of light emitting diodes (LED) comprise GaN (gallium nitride) light emitting diodes, indium gallium nitride (InGaN) light emitting diodes or a combination thereof.

In some embodiments of the method, the phosphor encapsulant has a composition including cerium doped yttrium aluminium garnet (YAG:Ce) crystals.

These and other features and advantages will become apparent from the following detailed description of illustrative embodiments thereof, which is to be read in connection with the accompanying drawings.

BRIEF DESCRIPTION OF THE DRAWINGS

The following description will provide details of embodiments with reference to the following figures wherein:

FIG. 3 is a top down view of a filament assembly including at Chip Scale Package (CSP) Light Emitting Diode (LEDs) illustrating the printed circuit providing electrical communication to the filament assembly including at Chip Scale Package (CSP) Light Emitting Diode (LEDs), in accordance with one embodiment of the present disclosure.

FIG. 4 is a perspective view of one embodiment of a Light Emitting Diode (LED) filament assembly including Chip Scale Package (CST) Light Emitting Diode (LEDs), in accordance with one embodiment of the present disclosure.

DETAILED DESCRIPTION

Figure 1:
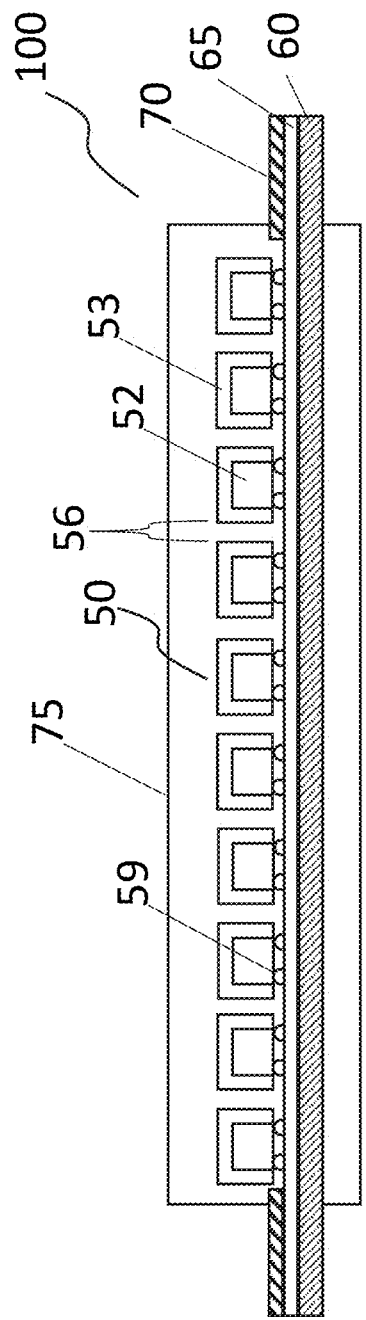
FIG. 1 is a side cross-sectional view of the filament assembly including at Chip Scale Package (CSP) Light Emitting Diode (LEDs), in accordance with one embodiment of the present disclosure.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

The LED filament includes multiple series-connected light emitting diodes LEDs on a transparent substrate, referred to as chip-on-glass (COG). These transparent substrates are made of ceramic or sapphire materials. This transparency allows the emitted light to disperse evenly and uniformly without any interference. An even coating of silicone resin/yellow phosphor blend material converts the blue light generated by the LEDs into light approximating white light of the desired color temperature, e.g., 2700 K to match the warm white of an incandescent bulb. The structure of these filaments generally includes an LED Chip, stents or substrate, and silicon glue mixed with phosphor. The LED chips are generally stamped on led stents, and then coated with the silicon glue, which is a mixture including the yellow color phosphor powder. However, LED meeting the above description often have yellow appearance, especially when the lamp incorporating these LEDs is under a power off status. Although, the filament lamp can meet the requirement of traditional lighting requirement, the yellow color on the filament is eye-catching, and unattractive, when the lamp is off. This is especially the case when employed in light fixtures having a geometry and style for a traditional or retro-styled lighting fixture, such as crystal chandeliers.

The structures and methods of the present disclosure can provide light emitting diode (LED) filaments that look inconspicuous. The structures and methods employ a reduced amount of phosphor. The LED filaments described herein have a reduced size and employ a thin layer of phosphor. A combination of the size, geometry and thickness of the filament components related to the layer of phosphor help to provide lamp designs incorporating the filaments that do not include the highly distinctive yellow color of designs including a greater amount of phosphor. The methods and structures of the present disclosure are now described with reference to FIGS. 1-6.

Referring to FIGS. 1-4, in some embodiments, to provide filaments 100 including a reduced phosphor content, the methods and structures begin with a filament geometry that is relatively small. For example, the length L1 can range from 3 mm to 30 mm, and the width W1 generally ranges from 0.3 mm to 2.0 mm. The diameter D1 of a filament can range from 0.6 mm to 2 mm.

In one embodiment, the light emitting diodes (LED) 50 may be Chip scale package (CSP) light emitting diodes (LEDs). Chip Scale Package (CSP) LEDs are Lambertian emitters presenting the highest luminance at smallest size available on the market. Chip scale package light emitting diodes do not include bond wires. When employing chip scale package LEDs, the LEDs are attached, e.g., bonded, to a substrate, in which a circuit, e.g., printed circuit, provides for electrical communications to the individual CUSP LEDs. In this embodiment, the CSP LED arrays are then coated with a clear transparent or translucent material having a very high transmittance with no phosphor. In some embodiments, white diffusive powder may be added into the adhesive, and the material can be translucent. This embodiment reduce the use of phosphor layers. By eliminating the encapsulating phosphor, the yellow coloring that is necessarily associated with phosphor is also eliminated from the design.

FIGS. 1-4 illustrate one embodiment of a filament structure 100 including chip scale package (CSP) light emitting diodes 50 as the light source (also referred to as light engine) for the filament. The filament structure 100 includes a base substrate 60 (also referred to as a stent or stent substrate). Atop the base substrate 60 is an insulating layer 65, and a conductor layer 70 may be present atop the insulating layer 65. The insulating layer 65 provides for electrical isolation of the chip scale package (CSP) light emitting diodes (LEDs) 50 and the base substrate 60. A circuit 54, e.g., printed circuit, provides for electrical communication between the chip scale package (CSP) light emitting diodes (LEDs) 50, and a conductive layer 70 that provides the electrode to the filament structure 100. The circuit 54 can be viewed in the top down perspective view that is depicted in FIG. 3.

Referring to FIGS. 1-4, encapsulating the chip scale package (CSP) light emitting diodes (LEDs), the insulating layer 65, the conductor layer 70 and the base substrate 50 is a transparent layer 70. The transparent layer 70 provides an element of protection for the chip scale package (CSP) light emitting diodes (LEDs) 50, as well as functioning for light diffusion to avoid light spotting of the light being emitted by the individually affixed chip scale package (CSP) light emitting diodes (LEDs) 50.

In some embodiments, the base substrate 60 can act as a frame and provides for structural stability of the filament structure 100. In some examples, the base substrate 60 is composed of a metal. Examples of metals suitable for the base substrate 60 can include stainless steel, copper, brass, aluminum, aluminum alloy, tungsten and combinations thereof. It is noted that the above provided metal compositions are provided for illustrative purposes only. Other compositions are equally applicable for providing the material of the base substrate 60. In some instances, the material selection is limited by materials that do not allow for the transmission of light.

The atop the base substrate 60 is the insulating layer 65. The metal composition of the base substrate 60 provides sufficient rigidity and does not transmit light therethrough. However, metals are electrically conductive. To provide isolation between the electrically conductive metal of the base substrate 60 and the chip scale package (CSP) light emitting diodes (LEDs) 50, the insulating layer 65 is deposited atop the base substrate prior to forming the printed circuit that provides electrical communication to the Chip scale package (CSP) light emitting diodes (LEDs) 50. The insulating layer 65 may be any dielectric/insulating material used in electronics for electrical isolation purposes. For example, the insulating layer 65 can be composed of alumina ($Al_2O_3$), silicon oxide ($SiO_2$), silicon carbide, as well as other metal oxides and ceramics etc. The insulating layer 65 may also be composed of glass fiber and glass fiber/epoxy compositions similar to those employed in FR4 dielectric compositions used in printed circuit boards.

Any dielectric deposition method may be employed in forming the insulating layer. For example, the dielectric material may be deposited onto the base substrate 60 using dip coating, curtain coating, deposition from solution, brush coating, etc. In other examples, a chemical vapor deposition (CVT)) process may be employed, such as metal organic chemical vapor deposition (MOCVD) or plasma enhanced chemical vapor deposition (PECVD). In even further embodiments, a physical vapor deposition (PVD) process may be employed, such as deposition via evaporation or deposition by sputtering. In some examples, the evaporation method may be by E-beam evaporation, ion assisted deposition (IAD), thermal evaporation, and combinations thereof. Sputtering methods can include magnetron sputtering, ion beam sputtering, pulsed laser deposition (PLD) and combinations thereof.

To provide the electrical communication to the later engaged chip scale package (CSP) light emitting diodes (LEDs), a printed circuit 54 is formed on the insulating layer 65. The printed circuit 54 includes electrical pathways that are in direct contact with the contacts to the later engaged chip scale package (CSP) light emitting diodes (LEDs) 50 and the later formed electrode layer (conductor layer 70). The printed circuit provides direct electrical communication between the chip scale package (CSP) light emitting diodes (LEDs) 50 and the conductor layer 70. As used herein, "direct electrical contact" denotes electrical communication across a physical electrically conductive medium. In the present case, the physical electrically conductive medium is provided by a metal track (or lead). The metal tracks (or leads) provide separate pathways to the anode and cathode contacts of the chip scale package (CSP) light emitting diodes (LEDs) 50, and to the anode and cathode contacts provided by the conductor layer 70. The metal tracks (also referred to as metal lines or leads) can be formed using a printing method. For example, the metal tracks may be composed of copper, aluminum, tungsten or alloys and combinations thereof. The metal tracks that provide the printed circuit 54 may be formed using printing technology, such as fused deposition modeling (FDM), selective laser sintering (SLS), stereo lithography apparatus (SEA), and combinations thereof.

In some embodiments, the tracks for the printed circuit 54 can lead to pads 51. The pads 51 are the points at which there is direct electrical contact between the printed circuit and the chip scale package (CSP) light emitting diodes (LEDs) 50.

As noted, the chip scale package (CSP) light emitting diodes (LEDs) 50 are engaged to circuit 54. The chip scale package (CSP) light emitting diodes (LEDs) 50 includes an LED die 52, and a phosphor coating 53. As used herein, "LED chip" and "light emitting semiconductor structure" refer to a stack of semiconductor layers, including an active region which emits light when biased to produce an electrical current flow through the device, and contacts attached to the stack. If a substrate on which the semiconductor layers are grown is present, "LED chip" includes the substrate. The active region of the LED can include an n-type region and a p-type region, which can be multiple layer structures of materials having the general formula $Al_xGa_yIn_{1-x-y}N$ ($0 \leq x \leq 1, 0 \leq y \leq 1, 0 \leq x+y \leq 1$), and may further contain group III elements such as boron and thallium. Sometimes, the nitrogen may be replaced by phosphorus, arsenic, antimony, or bismuth. In some embodiments, the n-type region and the p-type region may be composed of a II-VI material. The LED die 52 may emit blue light.

"Phosphor" refers to any luminescent materials which absorb light of one wavelength and emits light of a different wavelength, and "light emitting device" refers to an LED chip coated with a layer, for example a phosphor layer, through which the emitted light passes. The phosphor coating 53 converts the blue light to a suitable white light to be emitted by a lamp.

The phosphor coating 53 provides a method for providing white light from blue light emitted by light emitting diode chip (also referred to as light emitting diode (LED) die 52). The phosphor white method produces white light in a single LED by combining a short wavelength LED such as blue or UV, and a yellow phosphor coating. The blue or UV photons generated in the LED either travels through the phosphor layer without alteration, or they are converted into yellow photons in the phosphor layer. The combinations of the blue and yellow photons combine to generate white light. Phosphor white may have a color rendering ranging from Ra70 to 85.

In a typical phosphor white manufacturing process, the phosphor coating 53, i.e., phosphor encapsulant, is deposited on the LED die 52. In some embodiments, the LED die 52 of the present disclosure may use a 450 nm-470 nm blue GaN (gallium nitride) LED or a 385 nm to 480 blue LED covered by a yellowish phosphor coating 53 usually made of cerium doped yttrium aluminium garnet (YAG:Ce) crystals which have been powdered and bound in a type of viscous adhesive. The LED chip emits blue light, part of which is converted to yellow by the YAG:Ce.

It is noted that gal hum nitride (GaN) is only one example of the composition that may be employed for the LED die 52. Other compositions are equally applicable so long as the light emitted by the selected composition can be converted to white light when passing through the phosphor coating 53. For example, in some embodiments, the composition of the LED die 54 can be indium gallium nitride (InGaN). A common yellow phosphor material composition is cerium-doped yttrium aluminium garnet (Ce3+:YAG).

Figure 2:
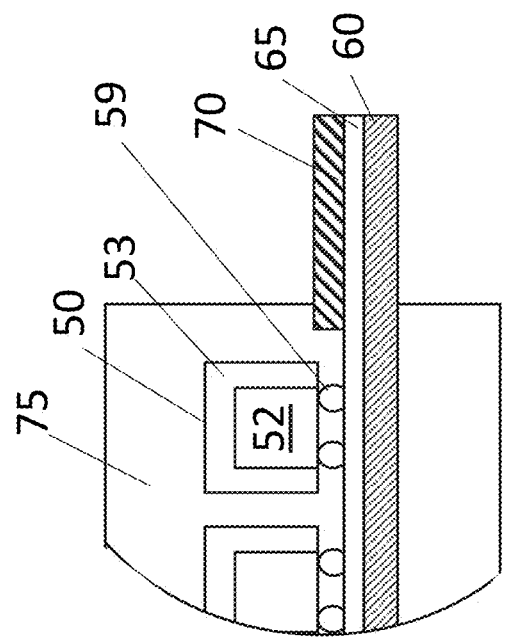
FIG. 2 is a magnified view of the Chip Scale Package (CSP) Light Emitting Diode (LEDs) being engaged to a filament substrate depicted in FIG. 1.

The methods and structures of the present disclosure provide sufficient phosphor to convert the blue light emitted from the LED die 52 to white light. However, the amount of phosphor is minimized to avoid the filament having a yellow color. For example, the phosphor may be disposed on only the light transmission surfaces of the LED die 52. In some examples, the phosphor coating may be present on only the upper surface of the LED die 52, and the sidewall surface of the LED die 52. This is distinguished from prior filament designs that encapsulate the entire array of LEDs, and portions of the substrate separating the adjustment array in a continuous layer of phosphor. In prior designs, the phosphor encapsulant is a blanket deposited layer covering a majority of the filament structure. Contrary to blanket deposited phosphor, the phosphor employed in the designs depicted in FIGS. 1-4, the light emitting diode (LED) chips 50 of the present disclosure includes a light transmission surface that is in contact with an individual portion of phosphor for the LED chip. By "individual portion" it is meant that each light emitting diode includes a discrete portion of phosphor relative to the portions of phosphor on the adjacent light emitting diode. Each light emitting diode 52 gets an individual portion of phosphor 53 that is physically separate and not physically connected to the phosphor that is present on the adjacently positioned light emitting diodes 50 on the substrate. As illustrated in FIGS. 1 and 2, the phosphor 53 may be present on the sidewalk of each LED die 52, and may be present on the upper surface of each LED die 52. As illustrated in FIGS. 1 and 2, no portion of phosphor encapsulant is present overlying the portions 56 of the filament substrate 60 (also referred to as filament stent) extending between the sidewalk of adjacently situated light emitting diodes 52 having phosphor encapsulant 53 present thereon.

Figure 5:
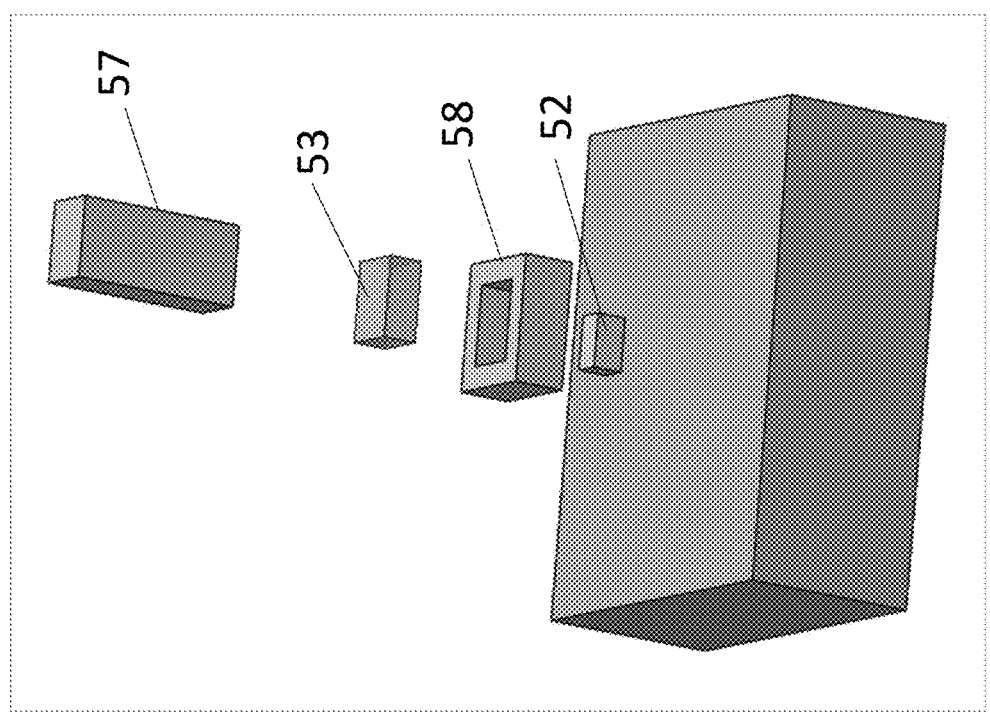
FIG. 5 is a perspective view illustrating the tooling for forming a phosphor layer on a Light Emitting Diode (LED), in accordance with one embodiment of the present disclosure.

In some embodiments, to form the yellow phosphor material, a solid state reaction is employed that can employ sol-gel and (co) precipitation methods. A phosphor 53 can be applied to an LED die 52 by mixing it with a liquid or gel binder, such as epoxy or silicone, which is then applied as a layer to the LED chip. Referring to FIG. 5, in one example, the LED die 52 may be placed within a first tool 58, e.g., part 1 of a mold, defining the perimeter of the Chip scale package (CSP) light emitting diodes (LEDs) 50, a blank layer of the yellow phosphor material 53' may be overlayed atop the LED die 52, and a second tool 57, part 2 of the mold, deforms the blank layer of yellow phosphor material into direct contact with the upper and sidewalls surface of the LED die 52. It is noted that the tooling depicted in FIG. 5 is only one embodiment of the present disclosure, and the methods and structures described herein should not be limited to only this example, as other methodologies are equally applicable for forming the chip scale package (CSP) light emitting diodes (LEDs) 50.

Figure 6:
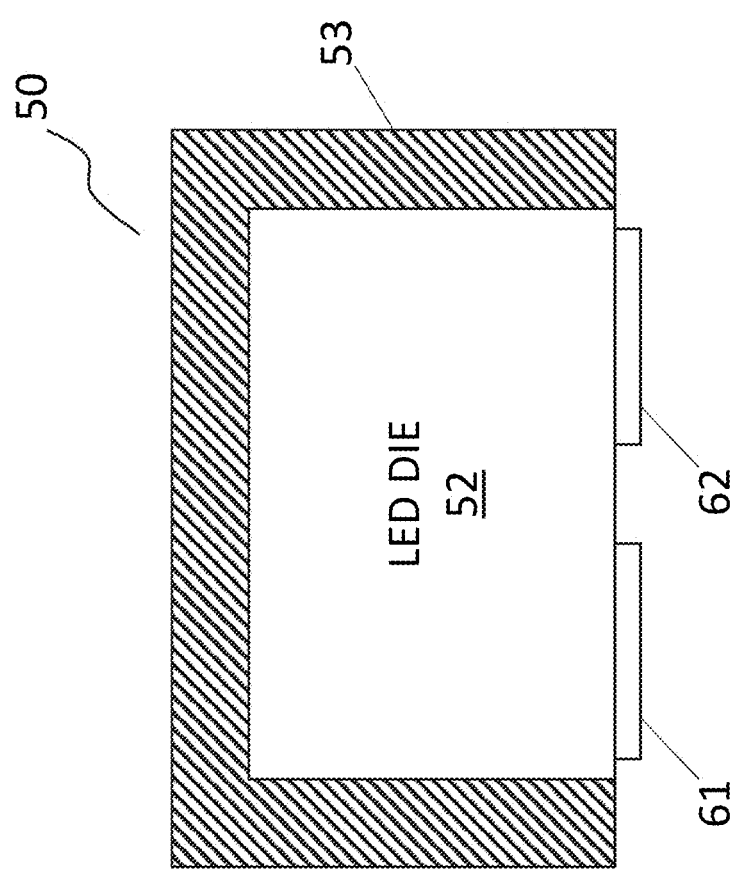
FIG. 6 is a side cross-sectional view of a Chip Scale Package (CSP) Light Emitting Diode (LED), in accordance with one embodiment of the present disclosure.

FIG. 6 illustrates a side cross-sectional view of a chip scale package (CSP) light emitting diode (LED) 50. The LED die 52 has a contact surface including two contacts 61, 62. The two contacts 61, 62 provide the positive and negative (cathode and anode) connections to the LED die. The upper surface is opposite the contact surface including the two contacts 61, 62, and is one of the light transmission surfaces for the LED die 52. At least one portion of the individual phosphor 53 for the chip scale package (CSP) light emitting diode (LED) 50 is in direct contact with the upper surface of the LED die 52. In some embodiments, the phosphor 53 is also present on the sidewall surface of the LED die 52. The phosphor 53 may be a conformal thickness coating. The term "conformal" denotes a layer having a thickness that does not deviate from greater than or less than 30% of an average value for the thickness of the layer. This denotes a range of thickness for the conformal layer having a lower value that is 30% less than the average value for the thickness of the conformal layer to an upper value that is 30% greater than the average value for the thickness of the conformal layer. In some examples, the thickness of the phosphor 53 may range from 150 microns to 500 microns. In one example, the thickness of the phosphor 53 is on the order of 300 microns. In some embodiments, because the upper and sidewalls surfaces are entirely covered in phosphor 53, the phosphor may be referred to as a phosphor encapsulant. In some embodiments, the phosphor 53 can be present solely on the upper surface of the LED die 52, as in some embodiments, it is not necessary for the phosphor 53 to be on the upper surface of the die.

Referring to FIGS. 1-6, the chip scale package (CSP) light emitting diode (LED) 50 are very compact. For example, the chip scale package (CSP) light emitting diode (LED) 50 may have a width and depth dimension ranging on the order of 2 mm to 5 mm, and a thickness ranging from 0.25 mm to 1.0 mm. In one example, the chip scale package (CSP) light emitting diode (LED) 50 measures 2.4 mm (wide)×2.4 mm (depth)×0.6 mm (height). In this example, the LED die 52 of the or the light-emitting surface (LES) of the chip scale package (CSP) light emitting diode (LED)s 50 is 2.1 mm×2.1 mm.

The chip scale package (CSP) light emitting diode (LED) 50 can be engaged to the contact pads of the circuit. The connective means may be any conventional adhesive or metal bumps such as solder, gold, or aluminum, and is referred to as metal bumps (also referred to as solder bumps) 59. The term "solder", as used herein, refers to any metal or metallic compound or alloy that is melted and then allowed to cool in order to loin two or more metallic surfaces together. Generally speaking, solders have melting temperatures in the range of 150° C. to 250° C. Solder bumps may be small spheres of solder (solder balls) that are bonded to contact areas, interconnect lines or pads of the LEDs 50 and the printed circuit 54. In some embodiments, the solder bumps can be made from lead-free solder mixtures or lead tin solder. In some examples, the chip scale package (CSP) light emitting diode (LED) 50 can then be picked and placed by either a high precision die bonder (with solder printed on substrate pads), or by a regular pick-place machine (also sometimes called a chip shooter).

The chip scale package (CSP) light emitting diode (LED) 50 may be engaged through their contacts 61, 62 to the pads of the circuit 54 by the metal bumps 59. It is noted that the above example is provided for illustrative purposes only. Any surface mount technology or electrically conductive adhesive may also be used to connect the chip scale package (CSP) light emitting diode (LED) 50 to the circuit 54.

The number of chip scale package (CSP) light emitting diodes (LEDs) 50 that are engaged to the filament structure can be dependent upon application, and the size of the filament structures, as well as the light requirements for the performance of the filament light emitting diodes (LEDs). Although the example depicted in FIGS. 3 and 4 includes sixteen (16) chip scale package (CSP) light emitting diodes (LEDs) 50, the present disclosure is not limited to only this example. For example, the number of chip scale package (CSP) light emitting diodes (LEDs) 50 in a single LED filament may range from 10 LEDs to 40 LEDs. In one example, the number the number of chip scale package (CSP) light emitting diodes (LEDs) 50 in a single LED filament may be equal to 28 LEDs.

Referring to FIGS. 1-4, the conductor layer 70 may be formed in direct electrical contact with the circuit 54 that brings electrical communication with the chip scale package (CSP) light emitting diode (LED) 50. The conductor layer 70 that is formed on opposing sides of the filament structure can provide the cathode and anode connections for the device. The conductor layer 70 may be formed atop the insulating layer 65. The conductor layer 70 may be formed using plating, electroplating, electroless plating etc. The conductor layer 70 may also be formed using printed technology similar to that described above for forming the circuit 54.

Still referring to FIGS. 1-4, the entirety of the structure, i.e., the chip scale package (CSP) light emitting diode (LED) 50, the circuit 54, the insulating layer 65, the conductor layer 70 and the substrate 60 may be encapsulated in a transparent layer 75. The transparent layer 75 may be composed of polymeric material, such as silicon glue, epoxy resin, polycarbonate, acrylic and combinations thereof. In some embodiments, the assembly of the chip scale package (CSP) light emitting diode (LED) 50, the circuit 54, the insulating layer 65, the conductor layer 70 and the substrate 60 are placed within a mold, and then the polymeric material that provides the composition of the transparent layer 75 is then injected into the mold around the entirety of the structure including the chip scale package (CSP) light emitting diode (LED) 50. The ends of the structure provided by the ends of the conductor layer 70 are not coated and provide the electrical connections, e.g., anode and cathode, to the filament structure.

The transparent layer 75 can provide both additional structure support for engaging the chip scale package (CSP) light emitting diodes (LEDs) 50 to the filament structure, and can also provide protection to the chip scale package (CSP) light emitting diodes (LEDs) 50. Additionally, the transparent layer 75 can also diffuse light that is being emitted by the chip scale package (CSP) light emitting diode (LED) 50. By diffusing the light emitted by the chip scale package (CSP) light emitting diode (LED) 50, light spotting is reduced.

The methods and systems described herein can provide a filament light emitting diode (LED) that can provide white light without employing phosphor is such a great extent that when the filament is emitting light it is noticeably yellow. By reducing the amount of phosphor in the filament, the structures and methods can provide a filament light emitting diode that can be integrated into a bulb design so that the bulb has the appearance of a tungsten bulb.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Spatially relative terms, such as "forward", "back" "left" "right", "clockwise", "counter clockwise". "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS.

Having described preferred embodiments of a LIGHT EMITTING DIODE FILAMENT INCLUDING CHIP SCALE PACKAGE LIGHT EMITTING DIODES TO REDUCE THE AMOUNT OF PHOSPHOR THAT IS INTEGRATED INTO THE FILAMENT, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required 1w the patent laws, what is claimed and desired protected by Letters Patent is set forth in the appended

What is claimed is:

1. A light emitting diode filament comprising:
   a metal stent substrate;
   a dielectric layer present on the metal stent substrate;
   a circuit having a plurality of contact pads arranged along a length of the metal stent substrate;
   light emitting diode (LED) chips engaged to the contact pads along the length of the metal stent substrate to provide that the light emitting diode (LED) chips are electrically connected in series, wherein each light emitting diode (LED) chip includes at least a light transmission surface that is in contact with an individual portion of phosphor for the LED chip, wherein the individual portion of phosphor covers an entirety of an upper surface of each light emitting diode (LED) chip and an entirety of a sidewall of each light emitting diode (LED) chip; and
   a sapphire encapsulant present in direct contact with an entirety of the individual portion of phosphor on the light emitting diode chips and the sapphire encapsulant is in direct contact with a portion of the dielectric layer between the light emitting diode (LED) chips that are positioned adjacent to one another, wherein the sapphire encapsulant provides an exterior surface for the light emitting diode filament over the light emitting diode (LED) chips.

2. The light emitting diode filament of claim 1, wherein the encapsulant is transparent or translucent.

3. The light emitting diode filament of claim 1, wherein a length for the LED filament ranges from 3 mm to 30 mm, and a width for the LED filament ranges from 0.3 mm to 2.0 mm.

4. The light emitting diode filament of claim 1, wherein the light emitting diode (LED) chips are chip scale package (CSP) light emitting diodes (LEDs).

5. The light emitting diode filament of claim 1, wherein the light transmission surface that is in contact with the individual portion of the phosphor is an upper surface of the light emitting diode chip that is opposite the surface of the light emitting diode chip that is bonded to the metal stent substrate.

6. The light emitting diode filament of claim 1, wherein the light transmission surface that the individual portion of the phosphor is present on also includes the sidewall surfaces of the light emitting diode chips.

7. The light emitting diode filament of claim 5, wherein the individual portion of the phosphor is a conformal layer of phosphor material.

8. A light emitting filament diode comprising:
a filament substrate;
a plurality of light emitting diodes (LEDs) electrically connected and disposed along a length of the filament substate;
a phosphor encapsulant layer having a conformal thickness present in direct contact with an entirety of an upper surface of each light emitting diode (LED) in the plurality of light emitting diodes (LEDs) and an entirety of the sidewalls of said each light emitting diode (LED) of the plurality of light emitting diodes (LEDs), wherein no portion of phosphor encapsulant is present contacting a portion of the filament substrate extending between the sidewalls of adjacently situated light emitting diodes; and
a sapphire encapsulant present in direct contact with the phosphor encapsulant layer that is present on the light emitting diode chips and a portion of the filament substrate that is between adjacently positioned light emitting diodes (LEDs) in the plurality of light emitting diodes (LEDs), wherein the sapphire encapsulant provides an exterior surface for the light emitting diode filament over the light emitting diode (LED) chips.

9. The light emitting filament diode of claim 8, wherein the filament substrate is comprised of a dielectric material or a metal selected from the group consisting of stainless steel, copper, brass, aluminum, aluminum alloy, tungsten and combinations thereof.

10. The light emitting filament diode of claim 8, wherein the encapsulant is transparent or translucent.

11. The light emitting filament diode of claim 10, wherein the filament substrate includes an insulating layer, wherein the insulating layer has a dielectric composition selected from the group consisting of alumina ($Al_2O_3$), silicon oxide ($SiO_2$), silicon carbide, glass fiber, glass fiber/epoxy compositions and combinations thereof.

12. The light emitting filament diode of claim 8, wherein the plurality of light emitting diodes (LEDs) use a 385 nm to 480 nm light emitting semiconductor material structure.

13. The light emitting filament diode of claim 8 which the plurality of light emitting diodes (LED) comprise GaN (gallium nitride) light emitting diodes, indium gallium nitride (InGaN) light emitting diodes or a combination thereof.

14. The light emitting filament diode of claim 8, wherein the phosphor encapsulant has a composition including cerium doped yttrium aluminium garnet (YAG:Ce) crystals.

15. A method of assembling a filament light emitting diode comprising:
forming a circuit on a filament stent substrate, wherein the circuit having pads arranged along of length of the filament stent substrate;
bonding light emitting diode (LED) chips to the circuit, the light emitting diode chips including a light emitting diode (LED) die having contacts on a contact surface side of the LED chips for the bonding to the pads of the printed circuit, and having an individual portion of a phosphor layer present on at least a light transmission surface of the LED die that is opposite the contact surface side of the die, wherein the individual portion of the phosphor layer was engaged to the light transmission surface of the LED die prior to the bonding of the light emitting diode chips to the circuit, wherein the individual portion of the phosphor layer covers an entirety of an upper surface of each of the light emitting diode (LED) chips and an entirety of a sidewall of each of the light emitting diode (LED) chips; and
forming a transparent encapsulant of sapphire directly on at least the light emitting diode (LED) die, the transparent encapsulant of the sapphire is in direct contact with the individual portion of the phosphor layer, and the transparent encapsulant of the sapphire is on a portion of the filament stent substrate between the light emitting diode (LED) chips that are positioned adjacent to one another, wherein the encapsulant of the sapphire provides an exterior surface for the filament light emitting diode.

16. The method of claim 15, wherein the bonding of the light emitting diode (LED) chips to the circuit comprises solder bonding.

17. The method of claim 15, wherein the plurality of light emitting diodes (LEDs) use a 385 nm-480 nm light emitting semiconductor material structure.

18. The method of claim 17 which the plurality of light emitting diodes (LED) comprise GaN (gallium nitride) light emitting diodes, indium gallium nitride (InGaN) light emitting diodes or a combination thereof.

19. The method of claim 15, wherein the individual portion of the phosphor layer has a composition including cerium doped yttrium aluminium garnet (YAG:Ce) crystals.

* * * * *